United States Patent [19]

Yokoyama

[11] 4,267,521

[45] May 12, 1981

[54] COMPOUND TRANSISTOR CIRCUITRY

[75] Inventor: Kenji Yokoyama, Hamamatsu, Japan

[73] Assignee: Nippon Gakki Seizo Kabushiki Kaisha, Hamamatsu, Japan

[21] Appl. No.: 9,087

[22] Filed: Feb. 2, 1979

Related U.S. Application Data

[63] Continuation of Ser. No. 859,192, Dec. 9, 1977, abandoned.

[30] Foreign Application Priority Data

Dec. 27, 1976 [JP] Japan .................... 51-176316

[51] Int. Cl.³ ............................... H03F 3/10
[52] U.S. Cl. .................................... 330/288
[58] Field of Search ............... 330/288; 307/296, 297, 307/313; 323/4

[56] References Cited

U.S. PATENT DOCUMENTS

| 3,619,658 | 11/1971 | Prunty | 323/4 X |
|---|---|---|---|
| 3,681,623 | 8/1972 | Hoffman, Jr. et al. | 307/297 |
| 3,914,683 | 10/1975 | van de Plassche | 323/4 X |
| 3,973,215 | 8/1976 | Ahmed | 330/288 X |
| 4,016,435 | 4/1977 | Voorman | 307/297 X |
| 4,027,177 | 5/1977 | Davis | 307/297 X |
| 4,029,974 | 6/1977 | Brokaw | 307/297 X |
| 4,081,696 | 3/1978 | Oda et al. | 307/297 X |

OTHER PUBLICATIONS

Allen, "Two-Terminal Constant-Current Device", *EEE*, Oct. 1965, pp. 71, 72.
Williams, "A D.C. Regulator For Low Voltages", *Electronic Engineering*, Mar. 1970, pp. 41–43.

Primary Examiner—James B. Mullins
Attorney, Agent, or Firm—Cushman, Darby & Cushman

[57] ABSTRACT

A compound transistor circuit having a high input impedance as well as a high gain, comprises a first and a second bipolar transistor, and a third and a fourth bipolar transistor both being complementary to the above first and second transistors. The emitters of the first and second bipolar transistors are coupled together to a first terminal, and their bases are connected together to the collector of the first bipolar transistor. The third and fourth bipolar transistor emitters are coupled together to a second terminal, and their bases are connected together to the collector of the fourth bipolar transistor. The collectors of the first and third bipolar transistors are connected in common to a third terminal, and the collectors of the second and fourth bipolar transistors are coupled to each other.

12 Claims, 5 Drawing Figures

COMPOUND TRANSISTOR CIRCUITRY

This is a continuation of application Ser. No. 859,192 filed Dec. 9, 1977 and now abandoned.

BACKGROUND OF THE INVENTION (a) Field of the Invention

The present invention pertains to a compound transistor circuit consisting of a combination of bipolar transistors, and more particularly it relates to a compound transistor circuit of bipolar transistors which requires no or negligible amount of input or offset current for operation.

(b) Description of the Prior Art

There has been desired a transistor having a high input impedance as well as a high gain, to make it possible to easily materialize an amplifier circuit of a simple arrangement which provides a high gain and a high input impedance. The existing transistors such as bipolar transistors and field effect transistors, however, cannot fully meet these requirements, for the following reasons.

A bipolar transistor has the disadvantage that its input impedance is fairly low since it requires a considerable amount of input and offset currents for operation. In contrast thereto, a field effect transistor is superior to a bipolar transistor with respect to the input impedance requirement, but on the other hand, its possible gain, in general, is quite poor as compared with a bipolar transistor.

SUMMARY OF THE INVENTION

It is, therefore, an object of the present invention to provide a compound transistor circuitry having a high input impedance as well as a high gain.

Another object of the present invention is to provide a compound transistor circuit of the type described above, which includes only bipolar transistors.

Still another object of the present invention is to provide an amplifier circuit of a simple arrangement, which provides both a high gain and a high input impedance.

According to the present invention, there is provided a compound transistor circuit comprising: a first terminal a second terminal; a third terminal; a first compound transistor having a current amplification factor of unity (one) and having an emitter connected to said first terminal, a base connected to said third terminal, and a collector; and a second compound transistor complementary to said first compound transistor and having a current amplification factor of unity (one) and having an emitter connected to said second terminal, a base connected to the collector of said first compound transistor, and a collector connected to said third terminal.

In an embodiment of the present invention, the first and second transistors are each comprised of a compound transistor consisting of bipolar transistors and each of these compound transistors constitutes a current mirror circuit.

These and other objects as well as the features and the advantages of the present invention will become apparent by reading the following detailed description of the preferred embodiments of the present invention when taken in conjunction with the accompanying drawings.

BRIEF DESCRIPTION OF THE DRAWINGS

Like parts are indicated by like reference symbols throughout the drawings.

DETAILED DESCRIPTION OF THE PREFERRED EMBODIMENTS

Figure 1:
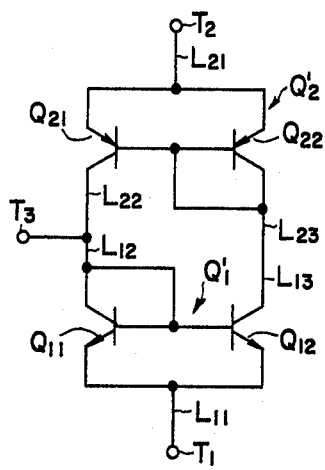
FIG. 1 is an electric circuit diagram showing an example of the compound transistor circuit according to the present invention.

In FIG. 1 is shown an example of the compound transistor circuit according to the present invention, which comprises a first pair of bipolar transistors $Q_{11}$ and $Q_{12}$ of n-p-n type, and a second pair of bipolar transistors $Q_{21}$ and $Q_{22}$ of p-n-p type. The paired first bipolar transistors $Q_{11}$ and $Q_{12}$ jointly constitute a first current mirror circuit $Q_1'$ as a first compound transistor, and the paired second bipolar transistors $Q_{21}$ and $Q_{22}$ jointly constitute a second current mirror circuit $Q_2'$ as a second compound transistor. The bipolar transistors $Q_{11}$ and $Q_{12}$ have their emitters connected together to a first terminal via a current path $L_{11}$, their bases connected together to a current path $L_{12}$, and their collectors connected, respectively, to the current path $L_{12}$ and a current path $L_{13}$. The bipolar transistors $Q_{21}$ and $Q_{22}$ have their emitters connected in common to a second terminal $T_2$ via a current path $L_{21}$, their bases connected together to a current path $L_{23}$, and their collectors connected to a current path $L_{22}$ and to the current path $L_{23}$, respectively. The current paths $L_{12}$ and $L_{22}$ are connected in common to a third terminal $T_3$. The current paths $L_{13}$ and $L_{23}$ are connected together. Alternatively, the terminal $T_3$ may be connected to the junction point of the current paths $L_{23}$ and $L_{13}$. As is apparent from FIG. 1, the emitters of like transistors $Q_{11}$ and $Q_{12}$ are directly connected to terminal $T_1$ with negligible resistance difference thereby preventing emitter base potential differences. The same is true for the connection to the second terminal $T_2$ of the emitters of like transistors $Q_{21}$ and $Q_{22}$.

It should be noted that the bipolar transistors $Q_{11}$ and $Q_{12}$ of the first pair may be of p-n-p type and the bipolar transistors $Q_{21}$ and $Q_{22}$ of the second pair may be of n-p-n type.

The operation of the above-mentioned compound transistor circuit of the present invention will hereunder be explained in detail with reference to FIGS. 2 through 4.

Figure 2:
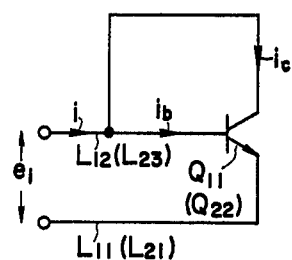
FIGS. 2 and 3 are electric circuit diagrams for explaining the function of the compound transistor circuit of FIG. 1 to obtain its equivalent circuit.

FIG. 2 shows a circuit portion of the bipolar transistor $Q_{11}$ (or $Q_{22}$), in which an input current i flowing in the current path $L_{12}$ (or $L_{23}$) is given by:

$$i = i_b + i_c \qquad \text{Eq. 1}$$
$$= i_b(1 + h_{fe})$$

wherein: $i_b$ and $i_c$ represent a base current and a collector current respectively, and $h_{fe}$ represents the current amplification factor (common-emitter static forward current transfer ratio) of the bipolar transistor $Q_{11}$ (or $Q_{22}$). The base current $i_b$ can be obtained as follows:

$$i_b = e_i/h_{ie} \qquad \text{Eq. 2}$$
$$= e_i/(1 + h_{fe})r_e$$

wherein: $e_i$ represents a voltage across the base and the emitter of the bipolar transistor $Q_{11}$ (or $Q_{22}$), $h_{ie}$ represents the input impedance (common-emitter static input resistance) of the transistor $Q_{11}$ (or $Q_{22}$), and $r_e$ represents the internal emitter resistance of the bipolar transistor $Q_{11}$ (or $Q_{22}$).

From both Equations 1 and 2, the input impedance $Z_i$ measured between the current paths $L_{12}$ and $L_{11}$ (or between the current paths $L_{23}$ and $L_{21}$) is given by:

$$Z_i = e_i/i \qquad \text{Eq. 3}$$
$$= h_{ie}/(1 + h_{fe})$$
$$= r_e$$

Figure 3:
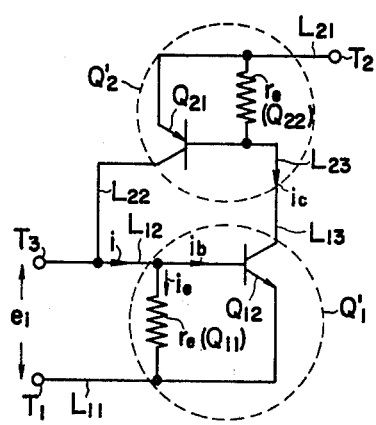

Accordingly, the compound transistor circuit of FIG. 1 may be expressed by FIG. 3, wherein a resistor $r_e$ connected in parallel between the base and the emitter of the bipolar transistor $Q_{12}$ corresponds to the bipolar transistor $Q_{11}$, and wherein another resistor $r_e$ connected in parallel between the base and the emitter of the bipolar transistor $Q_{21}$ corresponds to the bipolar transistor $Q_{22}$. If the internal emitter resistance $r_e$ of transistors $Q_{11}$ and $Q_{12}$ (or $Q_{21}$ and $Q_{22}$) are equal, then the current i flowing through the current path $L_{12}$ (or $L_{23}$) is given by:

$$i = i_e + i_b \qquad \text{Eq. 4}$$
$$= e_i/r_e + e_i/h_{ie}$$
$$= e_i(2 + h_{fe})/r_e(1 + h_{fe})$$
$$i_c = i_b \cdot h_{fe} \qquad \text{Eq. 5}$$
$$= e_i \cdot h_{fe}/(1 + h_{fe})r_e$$

Therefore, from the Equations 4 and 5, the over-all current amplification factor $h_{fe}'$ of the compound transistor, i.e. the current mirror circuit $Q_1'$ (or $Q_2'$) is as follows:

$$h_{fe}' = i_c/i \qquad \text{Eq. 6}$$
$$= h_{fe}/(2 + h_{fe})$$

If the value of $h_{fe}$ for $Q_{12}$ (or $Q_{21}$) is sufficiently larger than two (2), $h_{fe}'$ for circuit $Q_1'$ (or $Q_2'$) may be regarded as unity (one).

Figure 4:
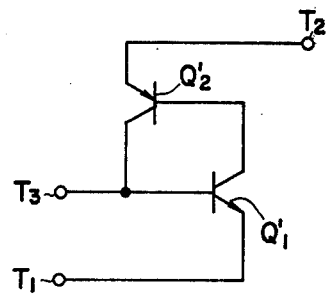
FIG. 4 is an electric circuit diagram showing the equivalent circuit of the compound transistor circuit of FIG. 1.

Thus, the compound transistor circuit shown in FIG. 1 can be illustrated in its final equivalent circuit in FIG. 4. In this Figure, equivalent bipolar transistors $Q_1'$ and $Q_2'$ have the same current amplification factors $h_{fe}'=1$, and the collector of the transistor $Q_1'$ is connected to the base of the transistor $Q_2'$, and vice versa. As the values of both collector currents and base currents of these two transistors $Q_1'$ and $Q_2'$ are the same because the current amplification factors of these transistors $Q_1'$ and $Q_2'$ are unity (one), there is no flow of an input or offset current from the terminal $T_3$ into the compound transistor circuit. That is, the compound transistor circuitry of the present invention has an infinite input impedance value. Furthermore, the transconductance $g_m$ of the compound transistor circuit of the present invention is given as follows and it is sufficiently larger than those of the conventional field effect transistors.

$$g_m = i_c/e_i \qquad \text{Eq. 7}$$
$$= h_{fe}/(1 + h_{fe})r_e$$
$$\approx 1/r_e$$

It should be understood that resistance elements having a small resistance value may be connected in series between the base and emitter of each of the bipolar transistors $Q_{11}$, $Q_{12}$, $Q_{21}$ and $Q_{22}$ to improve the linearity in the transconductance $g_m$ of the compound transistor circuit.

Figure 5:
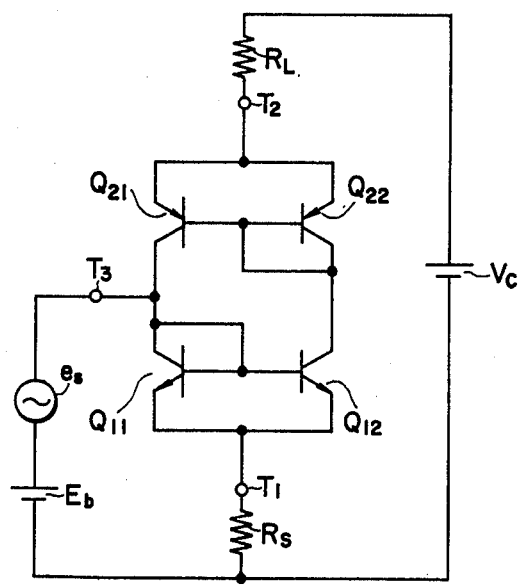
FIG. 5 is an electric circuit diagram showing an amplifier circuit employing the compound transistor circuit of FIG. 1 as its active element.

An example of an amplifier circuit employing the compound transistor circuit of the present invention as its amplifying element is illustrated in FIG. 5. The terminal $T_2$ is connected through a load resistor $R_L$ to the positive side of a dc voltage source $V_c$; the terminal $T_1$ is connected through a resistor $R_s$ to the negative side of the dc voltage source $V_c$; and between the terminal $T_3$ and the negative side of the voltage source is connected a signal source $e_s$ in series with a biasing voltage source $E_b$.

The voltage gain $A_v$ is expressed by:

$$A_v = g_m \cdot R_L/(1 + g_m \cdot R_s) \qquad \text{Eq. 8.}$$

If the resistor $R_s$ has a sufficiently small resistance value, the voltage gain $A_v$ will become nearly equal to $g_m \cdot R_L$. Conversely, if the resistor $R_s$ has enough resistance value to sufficiently perform the negative feedback action for the compound transistor circuit employed, then an enhanced linearity of the voltage gain of the circuit is attained, but the voltage gain itself is reduced.

As described above, according to the present invention, there can be provided a compound transistor circuit having a high input impedance as well as high gain, and accordingly it is possible to materialize an amplifier circuit which is simple in structure and which provides both a high input impedance and a high gain.

What is claimed is:

1. An amplifier having an improved high gain compound bipolar transistor arrangement, comprising:
   first, second and third terminals,
   a first compound bipolar transistor circuit having first and second like bipolar transistors both of which are of one conductivity type and each having a collector, emitter and base, said bases being connected to the collector of said first bipolar transistor, and means preventing emitter base potential differences including a direct connection of said emitters said first terminal,
   a second compound bipolar transistor circuit having third and fourth like bipolar transistors both of which are of a conductivity type opposite to said one conductivity type and each having a collector, emitter and base, said bases being connected to the collector of said fourth bipolar transistor, and means preventing emitter base potential differences between said third and fourth transistors including a direct connection of the emitters thereof to said second terminal,
   said first and third transistor collectors being connected to said third terminal,
   said second and fourth transistor collectors being connected to each other, means including the over-all current amplification factors of said first and second compound transistor circuits being substantially equal to each other for causing each of said compound transistor circuits to be current mirror circuits, a dc voltage source connected between said first and second terminals, a load connected in series with said dc voltage source, a biasing voltage source connected across said first and third terminals for supplying a biasing voltage thereto, and a variable input signal source connected in series with said biasing voltage for supplying a variable input signal to said third terminal for controlling the current across said first and second terminals for said load.

2. An arrangement as in claim 1 wherein each of said bipolar transistors has an internal emitter resistance, the internal emitter resistances of said first and second bipolar transistors being substantially equal to each other, and the internal emitter resistances of said third and fourth bipolar transistors being substantially equal to each other.

3. An amplifier as in claim 1 wherein each of said second and third transistors has a common-emitted forward current transfer ratio substantially larger than two.

4. An amplifier as in claim 1 wherein the transconductances of said first and second compound transistor circuits are approximately equal to the reciprocal of the emitter resistances of said second and third transistors, respectively.

5. An amplifier as in claim 1, 2, 3, or 4 wherein the said over-all current amplification factor of each said compound transistor circuits is unity.

6. An amplifier as in claim 5 wherein:

the emitters of said first and second transistors are connected to said first terminal with negligible resistance difference, and the emitters of said third and fourth transistors are connected to said second terminal with negligible resistance difference.

7. An amplifier having an improved high gain compound bipolar transistor arrangement, comprising:

first, second and third terminals, a first compound bipolar transistor circuit having first and second like bipolar transistors both of which are of one conductivity type and each having a collector, emitter and base, said bases being connected to the collector of said first bipolar transistor, and means preventing emitter base potential differences including a direct connection of said emitters to said first terminal, said bipolar transistors having respective internal emitter resistances which are substantially equal to each other, a second compound bipolar transistor circuit having third and fourth like bipolar transistors both of which are of a conductivity type opposite to said one conductivity type and each having a collector, emitter and base, said bases being connected to the collector of said fourth bipolar transistor, and means preventing emitter base potential differences between said third and fourth transistors including a direct connection of the emitters thereof to said second terminal, said third and fourth transistors having respective internal emitter resistances which are substantially equal to each other, said first and third transistor collectors being connected to said third terminal, said second and fourth transistor collectors being connected to each other, each of said second and third transistors having a current amplification factor substantially larger than two, means including the over-all current amplification factors of said first and second compound transistor circuits being substantially equal to each other for causing each of said compound transistor circuits to be current mirror circuits, a dc voltage source connected between said first and second terminals, a load connected in series with said dc voltage source, a biasing voltage source connected across said first and third terminals for supplying a biasing voltage thereto, and a variable input signal source connected in series with said biasing voltage for supplying a variable input signal to said third terminal for controlling the current across said first and second terminals for said load.

8. An amplifier as in claim 7 wherein the transconductances of said first and second compound transistor circuits are approximately equal to the reciprocal of the emitter resistances of said second and third transistors, respectively.

9. An amplifier as in claim 7 or 8 wherein the said over-all current amplification factor of each said compound transistor circuits is unity.

10. An amplifier as in claim 9 wherein:

the emitters of said first and second transistors are connected to said first terminal with negligible resistance difference, and the emitters of said third and fourth transistors are connected to said second terminal with negligible resistance difference.

11. An amplifier as in any one of claims 1, 2, 3, 4, 7 and 8 which further comprises:

the said over-all amplification factor of each of said compound transistor circuits being unity and the internal impedance across said first and third terminals being substantially infinite for substantially eliminating any requirement of input and offset currents from said input signal and biasing voltage sources for operation of said amplifier.

12. An amplifier as in claim 11 wherein:

the emitters of said first and second transistors are connected to said first terminal with negligible resistance difference, and the emitters of said third and fourth transistors are connected to said second terminal with negligible resistance difference.

* * * * *